(12) United States Patent
Otremba et al.

(10) Patent No.: US 7,868,465 B2
(45) Date of Patent: Jan. 11, 2011

(54) SEMICONDUCTOR DEVICE WITH A METALLIC CARRIER AND TWO SEMICONDUCTOR CHIPS APPLIED TO THE CARRIER

(75) Inventors: Ralf Otremba, Kaufbeuren (DE); Joachim Mahler, Regensburg (DE); Bernd Rakow, Regensburg (DE); Reimund Engl, Regensburg (DE); Rupert Fischer, Maxhuette-Haldhof (DE)

(73) Assignee: Infineon Technologies AG, Neubiberg (DE)

( * ) Notice: Subject to any disclaimer, the term of this patent is extended or adjusted under 35 U.S.C. 154(b) by 191 days.

(21) Appl. No.: 11/757,649

(22) Filed: Jun. 4, 2007

(65) Prior Publication Data

US 2008/0296782 A1    Dec. 4, 2008

(51) Int. Cl.
*H01L 23/48* (2006.01)
*H01L 21/58* (2006.01)
(52) U.S. Cl. .......... 257/783; 257/E23.01; 257/E21.505; 257/685; 257/723; 257/784; 257/786; 257/712; 257/713; 257/717; 257/720; 257/676
(58) Field of Classification Search ................ 257/723, 257/782, 783, 685, 686, 777, E21.505, E23.01, 257/784, 786, 712, 713, 717, 720, 675; 438/107
See application file for complete search history.

(56) References Cited

U.S. PATENT DOCUMENTS

| | | | |
|---|---|---|---|
| 5,544,412 A | 8/1996 | Romero et al. | |
| 5,686,758 A * | 11/1997 | Arai et al. | 257/693 |
| 6,132,865 A * | 10/2000 | Oka et al. | 428/344 |
| 6,407,411 B1 | 6/2002 | Wojnarowski et al. | |
| 6,436,732 B2 | 8/2002 | Ahmad | |
| 6,756,689 B2 | 6/2004 | Nam et al. | |
| 6,992,380 B2 * | 1/2006 | Masumoto | 257/709 |
| 7,157,791 B1 * | 1/2007 | Lin | 257/698 |
| 2004/0125579 A1 * | 7/2004 | Konishi et al. | 361/783 |
| 2004/0189229 A1 | 9/2004 | Nadd et al. | |
| 2005/0040522 A1 * | 2/2005 | Takehara et al. | 257/723 |
| 2005/0051356 A1 * | 3/2005 | Sumi et al. | 174/257 |
| 2006/0033122 A1 | 2/2006 | Pavier et al. | |
| 2006/0056213 A1 | 3/2006 | Lee et al. | |
| 2006/0225918 A1 * | 10/2006 | Chinda et al. | 174/260 |
| 2008/0258277 A1 * | 10/2008 | Hosseini et al. | 257/676 |

FOREIGN PATENT DOCUMENTS

| | | |
|---|---|---|
| DE | 2837300 A1 | 3/1980 |
| DE | 19626100 C1 | 12/1997 |
| DE | 10030427 A1 | 1/2002 |
| DE | 10122191 A1 | 8/2002 |
| DE | 10117775 A1 | 10/2002 |
| DE | 102004040773 B3 | 5/2005 |
| DE | 102004026159 B3 | 2/2006 |
| JP | 2006-318980 | * 11/2006 |

* cited by examiner

*Primary Examiner*—Alexander O Williams
(74) *Attorney, Agent, or Firm*—Dicke, Billig & Czaja, PLLC

(57) ABSTRACT

A semiconductor device is disclosed. One embodiment provides a device including a carrier, an electrically insulating layer applied onto the carrier, an adhesive layer applied to the electrically insulating layer. A first semiconductor chip applied to the adhesive layer.

15 Claims, 5 Drawing Sheets

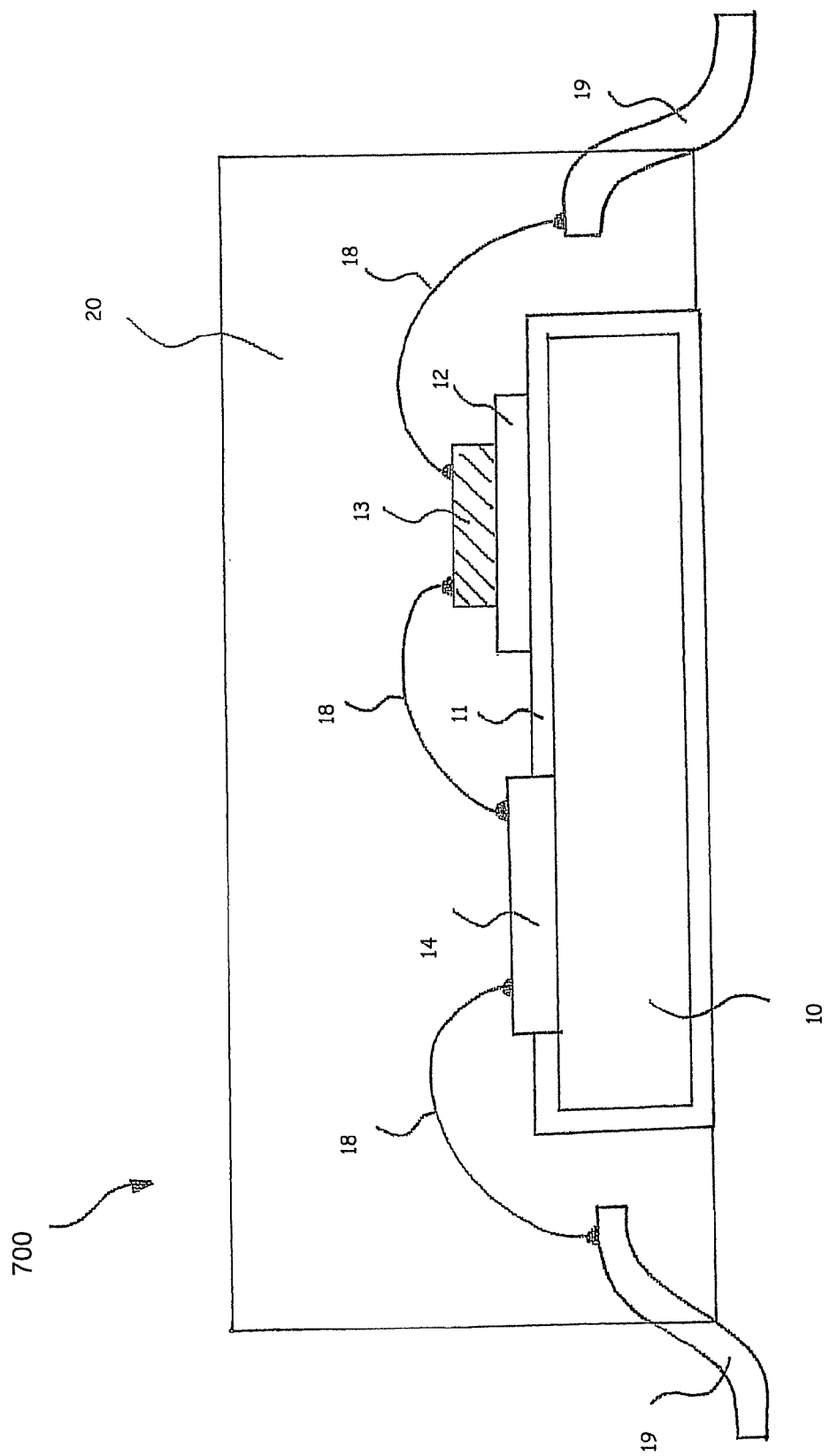

US 7,868,465 B2

SEMICONDUCTOR DEVICE WITH A METALLIC CARRIER AND TWO SEMICONDUCTOR CHIPS APPLIED TO THE CARRIER

BACKGROUND

This invention relates to a semiconductor device and a method of assembling thereof.

Power semiconductor chips may, for example, be integrated into semiconductor devices. Power semiconductor chips are suitable in particular for the switching or control of currents and/or voltages.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 6A to 5D schematically illustrate an exemplary embodiment of a method to fabricate a device.

FIG. 7 schematically illustrates a device 700 according to a an exemplary embodiment.

DETAILED DESCRIPTION

Figure 1:
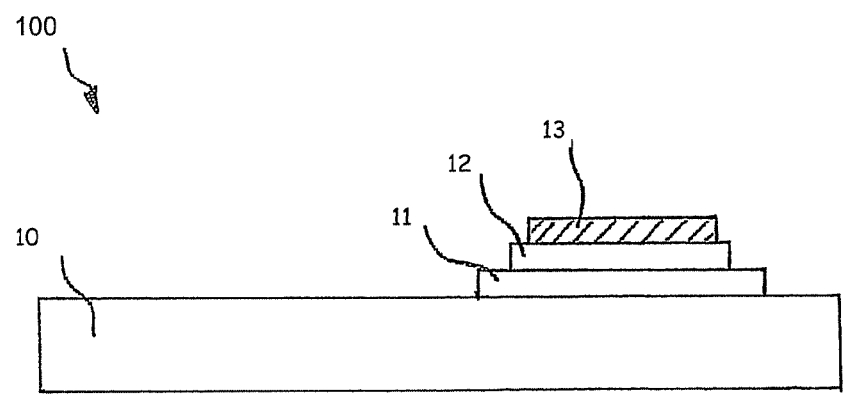
FIG. 1 schematically illustrates a device according to an exemplary embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with a semiconductor chip applied to a carrier are described below. The carrier may be of any shape, size or material. During the fabrication of the device the carrier may be provided in a way that other carriers are arranged in the vicinity and are connected by connection means to the carrier with the purpose of separating the carriers. The carrier may be fabricated from metals or metal alloys, in particular copper, copper alloys, aluminum, aluminum alloys, or other materials. It may further be electrically conductive and may serve, inter alia, as a heat sink for dissipating the heat generated by the semiconductor chip. The carrier may be, for example, a leadframe.

The semiconductor chips described below may be of extremely different types and may include for example, integrated electrical or electro-optical circuits. The semiconductor chips may be, for example, configured as power transistors, power diodes, control circuits, microprocessors or microelectromechanical components. Semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in particular on its two main surfaces, that is to say on its top side and underside. In particular, power transistors and power diodes may have a vertical structure. By way of example, the source terminal and gate terminal of a power transistor and the anode terminal of a power diode may be situated on one main surface, while the drain terminal of the power transistor and the cathode terminal of the power diode are arranged on the other main surface. A power diode may be embodied in particular as a Schottky diode. Furthermore, the semiconductor chips described below may include integrated circuits to control the integrated circuits of other semiconductor chips, for example, the integrated circuits of power transistors or power diodes. The semiconductor chips need not be manufactured from specific semiconductor material and, furthermore, may contain inorganic and/or organic materials that are not semiconductors, such as for example, insulators, plastics or metals. Moreover, the semiconductor chips may be packaged or unpackaged.

The semiconductor chips may have contact pads which allow electrical contact to be made with the semiconductor chips. The contact pads may be composed of any desired electrically conductive material, for example, of a metal, such as aluminum, gold or copper, a metal alloy or an electrically conductive organic material. The contact pads may be situated on the active surfaces of the semiconductor chips or on other surfaces of the semiconductor chips.

The semiconductor chips may be in a functional relationship to each other, in particular a relationship wherein, if more than one semiconductor chip is employed, an at least first one of the semiconductor chips controls at least a second one of the semiconductor chips.

An electrically insulating layer may be arranged over the carrier. The electrically insulating layer may consist of any material, for example, it may be fabricated from metal oxides, in particular aluminum oxide, silver oxide, titanium oxide, copper oxide, chromium oxide or zinc oxide, silicon oxide, diamond-like carbon, imides, organic materials, ceramic materials, glasses or polymers. If the electrically insulating layer is fabricated from silicon oxide, it may further contain other elements, such as phosphor or bor. The thickness of electrically insulating layer may, for example, be in the range between 10 nm and 150 µm, in particular it may be in the range between 1 µm and 20 µm. The electrically insulating layer may cover any fraction of any number of surfaces of the carrier and may additionally cover any other part of the device to any degree, in particular bonding wires, semiconductor chips and contact elements of semiconductor chips.

The electrically insulating layer may be fabricated by any means appropriate to fabricate electrically insulating layers. The term "electrically insulating" refers to the property of the layer to be at most only marginally electrically conductive relatively to other components of the device. In particular, the term "electrically insulating" refers to the at most only marginal electrical conductivity in a direction mainly perpendicular to the plane of extension of the electrically insulating layer.

The electrically insulating layer may have adhesive properties with respect to the carrier and also to molding materials applied to the device with the purpose of packaging the part of the carrier where semiconductor chips are placed. The adhesiveness of the electrically insulating layer with respect to molding materials may vary according to the material of the mold.

Furthermore, an adhesive layer may be arranged over the carrier. The adhesive layer may have adhesive properties of arbitrary degree. The adhesive layer may adhere to any material, in particular to materials used to fabricate the electrically insulating layer and outer parts of semiconductor chips. The adhesive layer may have an arbitrary thickness, in particular in the range between 10 nm and 150 µm, in particular in the range between 5 µm and 50 µm. The adhesive layer may have in terms of electrical conductivity arbitrary properties, i.e. the adhesive layer may be electrically insulating or electrically conductive. The adhesive layer may additionally contain particles to increase its thermal conductivity, in particular silver particles.

The layers which are applied over the carrier may be deposited by any kind of depositing method, in particular galvanic deposition, physical vapor deposition, chemical vapor deposition, sputtering, spin-on processes, spray depositing or ink jet printing.

The number of layers used to fabricate the device may not be limited to one or two, in fact, any number of layers stacked on top of each other may be provided. Multiple electrically insulating layers may be stacked on top of each other, but may also be separated by one or more layers without electrically insulating properties of arbitrary thickness. Each of the multiple electrically insulating layers may have a different thickness, material composition and degree of carrier-covering than the remaining number of electrically insulating layers used to fabricate the device.

Parts of the electrically insulating layer which covers a semiconductor chip may be removed in order to be able to establish electrical contacts with the contact elements of the semiconductor chip. For example, prior to applying the electrically insulating layer to the carrier, contact elements or parts of the semiconductor chips may be covered by a masking layer to prevent the electrically insulating layer to be deposited on the areas covered by the masking device. After the deposition of the electrically insulating layer, the masking layer is lift off. The insulating layer covering the contact elements of the semiconductor chip may be removed while forming an electrical contact with the contact element, for example, by wire bonding through the electrically insulating layer utilizing increased temperature or ultrasound or a laser beam. Furthermore, when using a galvanic method to deposit the electrically insulating layer, an appropriate electrical potential may be applied to the contact elements of the semiconductor chip to prevent the contact elements to be covered with the electrically insulating layer.

FIG. 1 illustrates a device 100 in a cross section as an exemplary embodiment. The device 100 includes a carrier 10 and an electrically insulating layer 11 that is applied onto the carrier 10 such that the electrically insulating layer 11 is in direct contact with the carrier 10. The fraction of the carrier 10 that is coated with the electrically insulating layer 11 may vary. The electrically insulating layer 11 may particularly also cover parts of the bottom surface and parts of the sides of the carrier 10. The device 100 further includes an adhesive layer 12 that is applied to the electrically insulating layer 11 as well as a first semiconductor chip 13 that is placed on the adhesive layer 12. The adhesive layer 12 ensures the adhesion of the first semiconductor chip 13 to the electrically insulating layer 11 and, in effect, to the carrier 10. The application of the first semiconductor chip 13 may be carried out in such a way that it is not electrically connected to the carrier 10.

Figure 2:
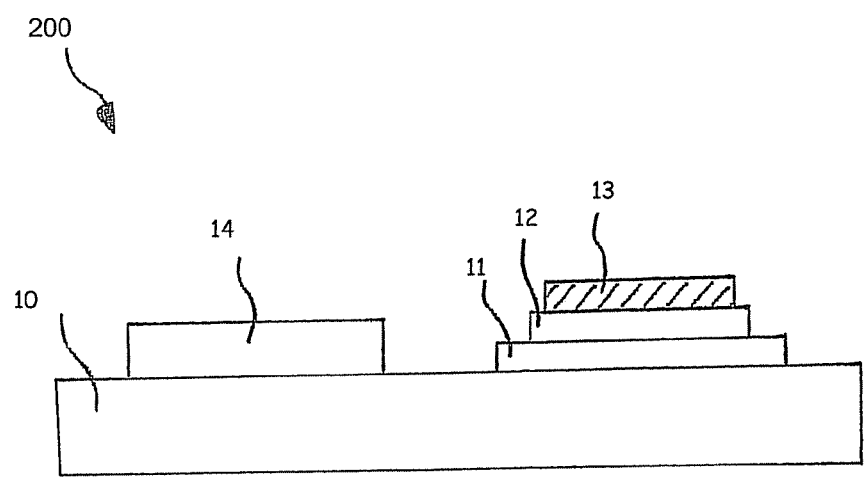
FIG. 2 schematically illustrates a device according to an exemplary embodiment.

FIG. 2 illustrates a device 200 as a further exemplary embodiment. The device 200 is a development of the device 100 illustrated in FIG. 1. Additionally to the aforementioned carrier 10, the electrically insulating layer 11, the adhesive layer 12 and the first semiconductor chip 13, a second semiconductor chip 14 is applied to the carrier 10. The application of the second semiconductor chip 14 may occur at any stage of the fabrication process of the device 100. For example, the second semiconductor chip 14 may be attached to the carrier 10 in such a way that the second semiconductor chip 14 is electrically connected to the carrier 10. In particular, the second semiconductor chip 14 may be a vertical power semiconductor, such as a power transistor or a power diode. A first main surface of the second semiconductor chip 14 which faces the carrier 10 may be in electrical contact to the carrier 10 which may be electrically conductive. The first semiconductor chip 13 may control the second semiconductor chip 14.

Figure 3:
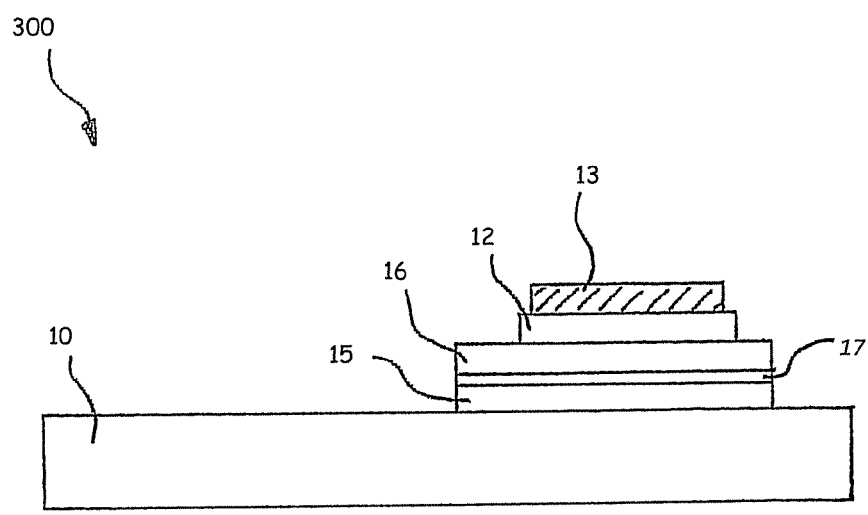
FIG. 3 schematically illustrates a device according to an exemplary embodiment.

FIG. 3 illustrates a device 300 as a further exemplary embodiment. The device 300 includes a carrier 10 and a first electrically insulating layer 15 that is arranged over the carrier 10. The fraction of the carrier 10 that is coated with the first electrically insulating layer 15 may vary. The first electrically insulating layer 15 may particularly also cover parts of the bottom surface and parts of the sides of the carrier 10. The first electrically insulating layer 15 does not need to be in direct contact to the carrier 10. Thus, a further layer, which may be conductive, can be also arranged between the carrier 10 and the first electrically insulating layer 15. The device 300 further includes a second electrically insulating layer 16 which is applied to the first electrically insulating layer 15. The first electrically insulating layer 15 and the second electrically insulating layer 16 may be separated by an intermediate layer 17. The intermediate layer 17 may be electrically conducting and may, for example, be fabricated from silver or aluminum. In particular, the intermediate layer 17 and the second electrically insulating layer 16 may cover the same fraction of the carrier 10 as the first electrically insulating layer 15. The intermediate layer 17 may help to reduce mechanical stress occurring in the electrically insulating layers 15 and 16. Additional electrically insulating layers and/or additional intermediate layers, which are not illustrated in FIG. 3, may be stacked on top of the electrically insulating layers 15 and 16. An adhesive layer 12 is deposited on the stack formed by the electrically insulating layers 15 and 16. A first semiconductor chip 13 is placed on the adhesive layer 12, the adhesive layer 12 ensuring the adhesion of the first semiconductor chip 13 to the electrically insulating layer 16 and, in effect, to the carrier 10. The application of the first semiconductor chip 13 may be carried out in such a way that it is not electrically connected to the carrier 10.

Figure 4:
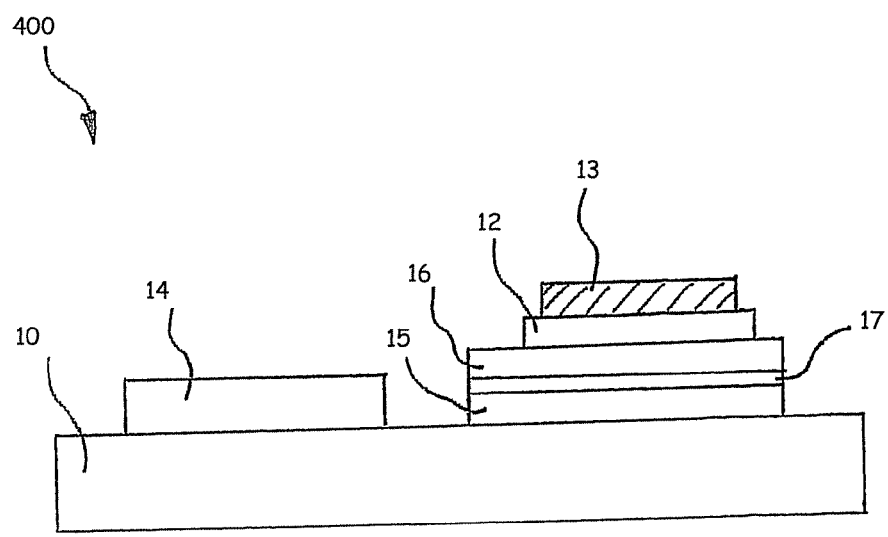
FIG. 4 schematically illustrates a device according to an exemplary embodiment.

FIG. 4 illustrates a device 400 as a further exemplary embodiment. The device 400 is a development of the device 300 illustrated in FIG. 3. Additionally to the aforementioned carrier 10, the electrically insulating layers 15 and 16, the adhesive layer 12 and the first semiconductor chip 13, a second semiconductor chip 14 is applied to the carrier 10. The application of the second semiconductor chip 14 may occur at any stage of the fabrication process of the device 300. For example, the second semiconductor chip 14 may be attached to the carrier 10 in such a way that the second semiconductor chip 14 is electrically connected to the carrier 10. In particular, the second semiconductor chip 14 may be a vertical power semiconductor, in particular a power transistor or a power diode, with a first main surface facing to the carrier 10 and being in electrical contact with the carrier 10. The first semiconductor chip 13 may control the second semiconductor chip 14.

Figure 5A:
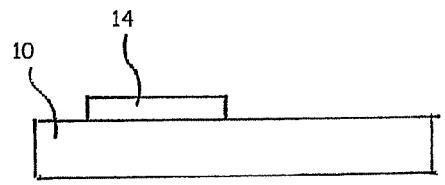
FIGS. 5A to 5D schematically illustrate an exemplary embodiment of a method to fabricate a device.
Figure 5B:
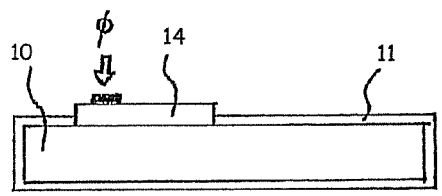
Figure 5C:
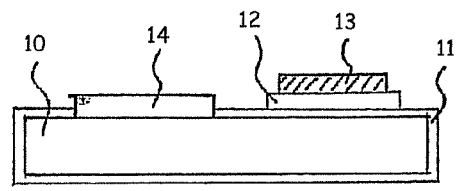
Figure 5D:
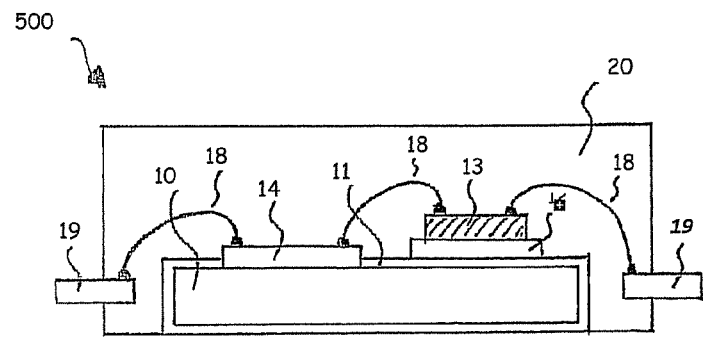

FIGS. 5A to 5D illustrate different stages of the fabrication of a device 500 which is illustrated in FIG. 5D. The device 500 is a development of the device 200 illustrated in FIG. 2.

FIG. 5A illustrates the carrier 10 and the second semiconductor chip 14. The second semiconductor chip 14 may be mounted on the carrier 10 in such a way that a first main surface of the second semiconductor chip 14 facing the carrier 10 is electrically connected to the carrier 10. In particular, the second semiconductor chip 14 may be a vertical power semiconductor, in particular a power transistor or a power diode. In case of the second semiconductor chip 14 being a power transistor, the drain terminal of the power transistor may be electrically connected to the carrier 10, which may be fabricated from a metal or a metal alloy or another electrically conductive material. The electrical connection between the second semiconductor chip 14 and the carrier 10 may, for example, be produced by reflow soldering, vacuum soldering, diffusion soldering or adhesive bonding by using a electrically conductive adhesive.

If diffusion soldering is used as a connecting technique, it is possible to use solder materials which lead to intermetallic phases after the end of the soldering operation at the interface between the carrier 10 and the second semiconductor chip 14 on account of interface diffusion processes. In this case, the use of AuSn, AgSn, CuSn, AgIn, AuIn or CuIn solders is conceivable, for example, for a copper or iron-nickel carrier 10. If the second semiconductor chip 14 is adhesively bonded to the carrier 10, it is possible to use conductive adhesives which may be based on epoxy resins and be enriched with gold, silver, nickel or copper in order to produce the electrical conductivity.

FIG. 5B illustrates the deposition of the insulating layer 11 which is galvanically deposited on the carrier 10 in the present embodiment. For that purpose, the carrier 10 together with the second semiconductor chip 14 may be dipped into an electrolyte solution containing the material to be deposited onto the carrier 10 or, alternatively, the electrolyte solution may be poured over the top surface of the carrier 10. Furthermore, an appropriate voltage is applied between the carrier 10 and at least one further electrode which is placed in the electrolyte solution. The voltage between the carrier 10 and the further electrode is set such that the insulating material precipitates at the exposed surface of the carrier 10. The insulating material may be a metal oxide, in particular titanium oxide, chromium oxide or zinc oxide.

Other deposition method may be used, such as physical vapor deposition, chemical vapor deposition, sputtering, spin-on processes, spray depositing, ink jet printing or other methods. The fraction of the carrier 10 that is coated with the electrically insulating layer 11 may vary and depends on the deposition method. The electrically insulating layer 11 may particularly also cover parts of the bottom surface and parts of the sides of the carrier 10.

Two or more electrically insulating layers may be stacked on top of each other as illustrated in FIG. 3. Furthermore, intermediate layers, which may be electrically conductive, may be arranged between the electrically insulating layers.

The second semiconductor chip 14 may have one or more contact elements on its second main surface which is exposed to the electrolyte solution during the galvanic deposition. In order to prevent the insulating material to coat the contact elements, a electrical potential $\phi$ may be applied to the contact elements. The potential $\phi$ is set such that galvanic deposition of the insulating material does not occur at the contact elements on the second main surface of the second semiconductor chip 14.

As illustrated in FIG. 5C, the adhesive layer 12 is deposited on the electrically insulating layer 11. The first semiconductor chip 13 is placed on the adhesive layer 12, the adhesive layer 12 ensuring the adhesion of the first semiconductor chip 13 to the electrically insulating layer 11 and, in effect, to the carrier 10. The adhesive layer 12 may be electrically insulating or electrically conductive. The electrical insulation of the first semiconductor chip 13 from the carrier 10 is ensured by the electrically insulating layer 11.

As illustrated in FIG. 5D, wire bonds 18 may be formed to electrically connect the first semiconductor chip 13 and the second semiconductor chip 14 with each other as well as with external devices, in particular pins 19, which may not be in direct contact with the carrier 10. The wire bonds 18 or at least some of them may also be formed prior to the galvanic deposition of the insulating layer 11. The wire bonds 18 allow to apply the potential $\phi$ to the contact elements on the second main surface of the second semiconductor chip 14 such that the galvanic deposition of the insulating material does not occur at these contact elements.

Furthermore, a molding compound 20 may be used to encapsulate the device 500. The molding compound 20 may encapsulate any portion of the device 500, in particular it may encapsulate the surface of the carrier 10 to which the semiconductor chips 13 and 14 are applied. The molding compound 20 may also encapsulate parts of the pins 19 in such a way that other parts of the pins 19 extend from the molding compound 20 to the outside with the purpose of connecting to external connection points. Furthermore, as illustrated in FIG. 5D a surface of the carrier 10 or the electrically insulating layer 11 and a surface of the molding compound 20 may form a plane. The molding compound 20 may be composed of any appropriate thermoplastic or thermosetting material, in particular it may be composed of material commonly used in contemporary semiconductor packaging technology. For example, the molding compound 20 may be composed of a material that adheres to the electrically insulating layer 11 in order to prevent humidity to penetrate the device 500. Various techniques may be employed to cover the components of the device 500 with the molding compound 20, for example, compression molding or injection molding.

Figure 6A:
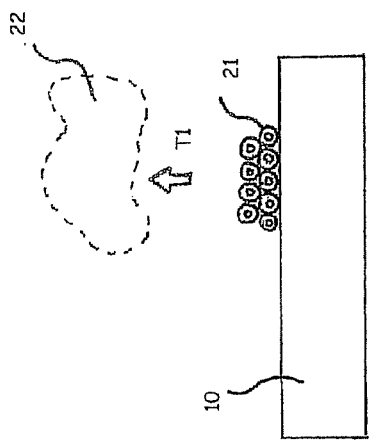
Figure 6B:
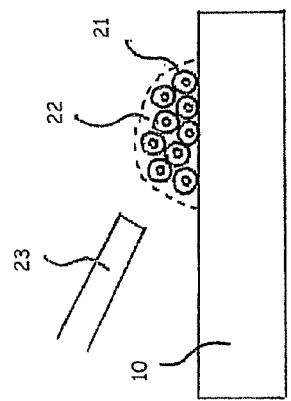
Figure 6C:
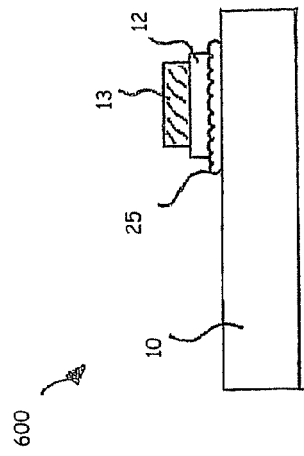
Figure 6D:
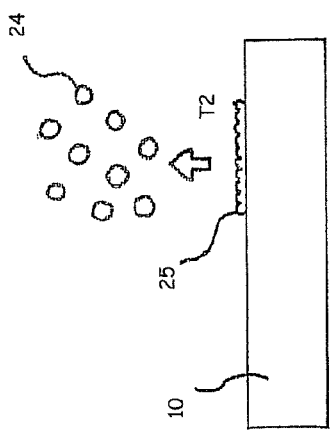

FIGS. 6A to 6D illustrate different stages of the fabrication of a device 600 which is illustrated in FIG. 6D. The device 600 is a development of the device 200 illustrated in FIG. 2.

FIG. 6A illustrates the carrier 10 and particles 21 that are applied to the carrier 10. The area of application of the particles 21 may include any fraction of the area of the carrier 10. The particles 21 may be fabricated from a ceramic material, in particular oxides, such as silicon oxide, aluminum oxide, zirconium oxide or titanium oxide, or nitrides, such as silicon nitride. The particles 21 may also be fabricated from any other inorganic material capable of forming ceramics, in particular glasses, such as silicon dioxide. The particles 21 may also be fabricated from organic materials, in particular tetraethylorthosilane (TEOS), polyimides, polyoxybenzazole, polybenzimidazole or high-temperature thermoplastic resins. The dimensions of the particles 21 may be of any size, in particular the extension of a particle 21 may be smaller than 100 nm but may also be larger than that. The particles 21 may further have certain thermodynamic properties, in particular they may have a relatively low melting temperature. The particles 21 may further be dispersed in a suitable liquid 22 appropriate to prevent premature agglomeration of the particles 21. The liquid 22 may, for example, be composed of acetone, ethanol, toluene or any other solvent. The application of the particles 21 may be performed by using an applicator 23. In particular, the applicator 23 may be an ink-jet printing device.

After the application of the particles 21 dispersed in the liquid 22 to the carrier 10, the carrier 10 and the particles 21 applied thereon are exposed to a temperature $T_1$ as illustrated in FIG. 6B. The temperature $T_1$ may be larger than room temperature, in particular it may be in the range from 50 to 300° C. The exposure time may be arbitrary, in particular it may be long enough to allow the liquid 22 to evaporate leaving the particles 21 localized on the carrier 10.

FIG. 6C illustrates a further exemplary embodiment of the method to fabricate the device 600. In the present embodiment the particles 21 are surrounded with a coating 24 in order to prevent premature agglomeration of the particles 21. The coating 24 may consist of an organic material or a polymer, in particular polyoxymethylene (POM) or polyvinylacetate (PVAC). The boiling temperature of the coating 24 may be larger than the boiling temperature of the liquid 22. The boiling temperature of the coating 24 may further be smaller than the sintering temperature of the particles 21. The carrier 10 and the particles 21 applied thereon are exposed to a temperature $T_2$ after the evaporation of the liquid 22 in order to remove the coating 24. The temperature $T_2$ may be larger than room temperature, in particular it may be in the range from 50 to 400° C. The exposure time may be arbitrary, in particular it may be long enough to cause the coating 24 to evaporate leaving the particles 21 localized on the carrier 10. Instead of coating all of the particles 21 with the coating 24, none of the particles 21 or only a fraction of them may be coated.

After the evaporation of the coating 24 the particles 21 may form a solid layer 25 by sintering or melting during the exposure to the elevated temperature $T_2$ or another appropriate temperature. The solid layer 25 may be of any thickness, in particular its thickness may be in the range from 1 to 5 μm. The solid layer 25 may be electrically insulating.

As illustrated in FIG. 6D, the adhesive layer 12 is deposited on the solid layer 25, and the first semiconductor chip 13 is placed on the adhesive layer 12. The adhesive layer 12 ensures the adhesion of the first semiconductor chip 13 to the solid layer 25 and, in effect, to the carrier 10. The application of the second semiconductor chip 13 may be carried out in such a way that it is not electrically connected to the carrier 10.

FIG. 7 illustrates a device 700 of a further embodiment. The second semiconductor chip 14 is placed on the carrier 10. The electrically insulating layer 11 formed by any method is applied to the carrier 10 in such a way that a main surface of the second semiconductor chip 14 is not covered by the electrically insulating layer 11. The adhesive layer 12 is applied to the electrically insulating layer 11. The first semiconductor chip 13 is applied to the adhesive layer 12. The wire bonds 18 are formed to connect the semiconductor chips 13 and 14 to each other and to the pins 19. The molding compound 20 encapsulates parts of the carrier 10, the electrically insulating layer 11, the adhesive layer 12, the semiconductor chips 13 and 14, the wire bonds 18 and the pins 19. The pins 19 may be bent in order to mount the device 700 on a circuit board.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device comprising:
   a carrier having a top main surface;
   an electrically insulating layer having a top main surface and a bottom main surface applied onto the carrier such that the bottom main surface of the electrically insulating layer faces the top main surface of the carrier;
   an adhesive layer having a top main surface and a bottom main surface applied to the electrically insulating layer such that the bottom main surface of the adhesive layer faces the top main surface of the electrically insulating layer;
   a first semiconductor chip applied to the adhesive layer; and
   a second semiconductor chip directly applied to the carrier and which is electrically connected to the carrier, wherein the second semiconductor chip is not covered by the electrically insulating layer.

2. The device of claim 1, comprising wherein the second semiconductor chip has a first contact element on a first main surface and a second contact element on a second main surface.

3. The device of claim 1, comprising wherein the second semiconductor chip is a power semiconductor.

4. The device of claim 1, comprising wherein the first semiconductor chip controls the second semiconductor chip.

5. The device of claim 1, comprising wherein a molding compound adheres to the electrically insulating layer.

6. The device of claim 1, wherein the first semiconductor chip has a bottom main surface and the electrically insulating layer is configured to electrically insulate the bottom main surface of the first semiconductor chip from the carrier.

7. The device of claim 1, wherein the electrically insulating layer is adapted to electrically insulate the adhesive layer from the carrier.

8. The device of claim 1, wherein the electrically insulating layer fully encloses the carrier except for an area of the carrier which is in direct contact with the second semiconductor chip.

9. The device of claim 8, including a molding compound adhered to the electrically insulating layer, wherein a surface of the electrically insulating layer forms a common plane with a surface of the molding compound.

10. The device of claim 1, including a molding compound adhered to the carrier, wherein the carrier has a bottom main surface forming a common plane with a surface of the molding compound.

11. The device of claim 2, wherein the first main surface of the second semiconductor chip faces the carrier, and wherein the first contact element of the second semiconductor chip is in direct contact with the carrier.

12. The device of claim 1, wherein the carrier is formed completely of a metallic material.

13. The device of claim 1, wherein the second semiconductor chip is a vertical structured semiconductor chip.

14. The device of claim 1, wherein the first semiconductor chip comprises integrated circuits.

15. The device of claim 1, wherein the first semiconductor chip and the second semiconductor chip are electrically connected by a wire bond.

* * * * *

UNITED STATES PATENT AND TRADEMARK OFFICE
CERTIFICATE OF CORRECTION

PATENT NO. : 7,868,465 B2
APPLICATION NO. : 11/757649
DATED : January 11, 2011
INVENTOR(S) : Otremba et al.

Page 1 of 1

It is certified that error appears in the above-identified patent and that said Letters Patent is hereby corrected as shown below:

Cover Page, item (75), Inventors, delete "Maxhuette-Haldhof" and insert in place thereof -- Maxhuette-Haidhof --.

Signed and Sealed this
Twelfth Day of April, 2011

David J. Kappos
*Director of the United States Patent and Trademark Office*